United States Patent
Doan et al.

(10) Patent No.: US 7,153,443 B2
(45) Date of Patent: *Dec. 26, 2006

(54) MICROELECTROMECHANICAL STRUCTURE AND A METHOD FOR MAKING THE SAME

(75) Inventors: Jonathan Doan, Mountain View, CA (US); Satyadev Patel, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 307 days.

This patent is subject to a terminal disclaimer.

(21) Appl. No.: 10/805,610

(22) Filed: Mar. 18, 2004

(65) Prior Publication Data

US 2006/0266730 A1 Nov. 30, 2006

Related U.S. Application Data (63) Continuation-in-part of application No. 10/402,789, filed on Mar. 28, 2003, now Pat. No. 6,849,471.

(51) Int. Cl.
*H01L 21/302* (2006.01)

(52) U.S. Cl. .............. 216/58; 430/327; 359/224; 359/872; 359/245; 216/79; 216/73; 438/21; 438/48

(58) Field of Classification Search .............. 216/58
See application file for complete search history.

(56) References Cited

U.S. PATENT DOCUMENTS

| | | | |
|---|---|---|---|
| 3,511,727 A | 5/1970 | Hays | |
| 4,190,488 A | 2/1980 | Winters | |
| 4,310,380 A | 1/1982 | Flamm et al. | |
| 4,498,953 A | 2/1985 | Cook et al. | |
| 4,551,197 A | 11/1985 | Guilmette et al. | |
| 4,695,700 A | 9/1987 | Provence et al. | |
| 4,740,410 A | 4/1988 | Muller et al. | |
| 4,749,440 A | 6/1988 | Blackwood et al. | |
| 4,789,426 A | 12/1988 | Pipkin | |
| 5,206,471 A | 4/1993 | Smith | |
| 5,262,000 A | 11/1993 | Welbourn et al. | |
| 5,310,626 A * | 5/1994 | Fernandes et al. | 430/327 |
| 5,330,301 A | 7/1994 | Brancher | |
| 5,439,553 A | 8/1995 | Grant et al. | |
| 5,441,597 A | 8/1995 | Bonne et al. | |
| 5,506,171 A * | 4/1996 | Leonard et al. | 216/2 |

(Continued)

FOREIGN PATENT DOCUMENTS

EP 0704884 A2 4/1996

(Continued)

OTHER PUBLICATIONS

Aliev et al., "Development of Si(100) Surface Roughness at the Initial Stage of Etching in F2 and XeF2 Gases Ellipsometric Study", Surface Science 442 (1999), pp. 206-214.

(Continued)

*Primary Examiner*—Nadine Norton
*Assistant Examiner*—Patricia A. George
(74) *Attorney, Agent, or Firm*—W. James Brady, III; Frederick J. Telecky, Jr.

(57) ABSTRACT

A microstructure and the method for making the same are disclosed herein. The microstructure has structural members, at least one of which comprises an intermetallic compound. In making such a microstructure, a sacrificial material is employed. After completion of forming the structural layers, the sacrificial material is removed by a spontaneous vapor phase chemical etchant.

57 Claims, 4 Drawing Sheets

U.S. PATENT DOCUMENTS

| | | |
|---|---|---|
| 5,534,107 A | 7/1996 | Gray et al. |
| 5,672,242 A | 9/1997 | Jen |
| 5,696,619 A | 12/1997 | Knipe et al. |
| 5,696,620 A | 12/1997 | Kim |
| 5,701,192 A | 12/1997 | Ji et al. |
| 5,702,569 A | 12/1997 | Park et al. |
| 5,716,495 A | 2/1998 | Butterbaugh et al. |
| 5,726,480 A | 3/1998 | Pister |
| 5,729,074 A | 3/1998 | Shiomi et al. |
| 5,753,073 A | 5/1998 | Jen |
| 5,757,456 A | 5/1998 | Yamazaki et al. |
| 5,757,539 A | 5/1998 | Min |
| 5,774,256 A | 6/1998 | Min et al. |
| 5,822,109 A | 10/1998 | Jeon |
| 5,835,256 A | 11/1998 | Huibers |
| 5,835,293 A | 11/1998 | Min et al. |
| 5,858,065 A | 1/1999 | Li et al. |
| 5,917,045 A | 6/1999 | Lewis et al. |
| 5,994,750 A | 11/1999 | Yagi |
| 6,020,215 A | 2/2000 | Yagi et al. |
| 6,051,503 A | 4/2000 | Bhardwaj |
| 6,104,425 A | 8/2000 | Kanno |
| 6,115,172 A | 9/2000 | Jeong |
| 6,126,585 A | 10/2000 | Norwood et al. |
| 6,159,851 A | 12/2000 | Chen et al. |
| 6,162,367 A | 12/2000 | Tai et al. |
| 6,197,610 B1 | 3/2001 | Toda |
| 6,203,715 B1 | 3/2001 | Kim et al. |
| 6,204,080 B1 | 3/2001 | Hwang |
| 6,238,581 B1 | 5/2001 | Hawkins et al. |
| 6,277,173 B1 | 8/2001 | Sadakata et al. |
| 6,290,864 B1 | 9/2001 | Patel et al. |
| 6,299,724 B1 | 10/2001 | Fayfield et al. |
| 6,328,801 B1 | 12/2001 | Gary et al. |
| 6,334,928 B1 | 1/2002 | Sekine et al. |
| 6,355,181 B1 | 3/2002 | McQuarrie |
| 6,396,619 B1 | 5/2002 | Huibers et al. |
| 6,409,876 B1 | 6/2002 | McQuarrie et al. |
| 6,436,229 B1 | 8/2002 | Tai et al. |
| 6,449,079 B1 | 9/2002 | Herrmann |
| 6,479,920 B1 | 11/2002 | Lal et al. |
| 6,500,356 B1 | 12/2002 | Goto et al. |
| 6,518,194 B1 | 2/2003 | Winningham et al. |
| 6,558,559 B1 | 5/2003 | Becker et al. |
| 6,576,489 B1 | 6/2003 | Leung et al. |
| 6,666,979 B1 | 12/2003 | Chinn et al. |
| 6,740,247 B1 | 5/2004 | Han et al. |
| 6,849,471 B1 * | 2/2005 | Patel et al. ............ 438/21 |
| 6,913,942 B1 * | 7/2005 | Patel et al. ............ 438/48 |
| 2001/0002663 A1 | 6/2001 | Tai et al. |
| 2002/0033229 A1 | 3/2002 | Lebouitz et al. |
| 2002/0047172 A1 | 4/2002 | Reid |
| 2002/0121502 A1 | 9/2002 | Patel et al. |
| 2002/0163051 A1 | 11/2002 | Gopal et al. |
| 2002/0164879 A1 | 11/2002 | Leung et al. |
| 2002/0185699 A1 | 12/2002 | Reid |
| 2002/0195423 A1 * | 12/2002 | Patel et al. ............ 216/73 |
| 2002/0196524 A1 | 12/2002 | Huibers et al. |
| 2003/0054588 A1 | 3/2003 | Patel et al. |
| 2003/0071015 A1 | 4/2003 | Chinn et al. |
| 2003/0073302 A1 * | 4/2003 | Huibers ............ 438/622 |
| 2003/0077878 A1 | 4/2003 | Kumar et al. |
| 2003/0080082 A1 | 5/2003 | Chinn et al. |
| 2003/0124848 A1 | 7/2003 | Chinn et al. |
| 2003/0166342 A1 | 9/2003 | Chinn et al. |
| 2003/0219986 A1 | 11/2003 | Rattner et al. |
| 2004/0035821 A1 | 2/2004 | Doan et al. |
| 2004/0069747 A1 | 4/2004 | Patel et al. |
| 2004/0165250 A1 | 8/2004 | Aubuchon |

FOREIGN PATENT DOCUMENTS

| | | |
|---|---|---|
| EP | 0822582 A2 | 2/1998 |
| EP | 0822584 A2 | 4/1998 |
| EP | 0838839 A2 | 4/1998 |
| EP | 0878824 A2 | 11/1998 |
| EP | 0955668 A2 | 11/1999 |
| EP | 0878824 A3 | 1/2000 |
| JP | 1982/57098679 A | 6/1982 |
| JP | 1983/58130529 A | 8/1983 |
| JP | 1985/60057938 A | 4/1985 |
| JP | 1986/61053732 A | 3/1986 |
| JP | 1986/61134019 A | 6/1986 |
| JP | 1986/61181131 A | 8/1986 |
| JP | 1986/61187238 A | 8/1986 |
| JP | 1986/61270830 A | 12/1986 |
| JP | 1987/62071217 A | 4/1987 |
| JP | 1988/63155713 A | 6/1988 |
| JP | 1989/01208834 A | 8/1989 |
| JP | 1989/10217921 A | 8/1989 |
| JP | 1990/02250323 A | 10/1990 |
| JP | 1991/03012921 A | 1/1991 |
| JP | 1992/04096222 A | 3/1992 |
| JP | 1995/07029823 A | 1/1995 |
| JP | 1997/09251981 A | 9/1997 |
| JP | 1998/10313128 A | 11/1998 |
| JP | 1998/10317169 A | 12/1998 |
| WO | WO-98/05605 | 2/1998 |
| WO | WO-98/13856 | 4/1998 |
| WO | WO-98/32163 | 7/1998 |
| WO | WO-99/01887 | 1/1999 |
| WO | WO-99/03313 | 1/1999 |
| WO | WO-99/49506 | 9/1999 |
| WO | WO-00/52740 | 8/2000 |

OTHER PUBLICATIONS

Glidemeister, J.M., "Xenon Difluoride Etching System" (Nov. 17, 1997).

Habuka et al., "Dominant Overall Chemical Reaction in a Chlorine Trifluoride-Silicon-Nitrogen System at Atmospheric Pressure", Japan Journal of Applied Physics vol. 38 (1999), pp. 6466-6469.

Hecht et al., "A Novel X-ray Photoelectron Spectroscopy Study of the Al/SiO2 Interface", J. Appl. Phys. vol. 57 (Jun. 15, 1985), pp. 5256-5261.

Houle, F.A., "Dynamic of SiF4 Desorption During Etching of Silicon by XeF2", IBM Almaden Research Center (Apr. 15, 1987), pp. 1866-1872.

Flamm et al., "XeF2 and F-Atom Reactions with Si: Their Significance for Plasma Etching", Solid State Technol. 26, 117 (1983).

Ibbotson et al., "Plasmaless Dry Etching of Silicon with Fluorine-containing Compounds", J. Appl. Phys. vol. 56 No. 10 (Nov. 1984), pp. 2939-2942.

Ibbotson et al., "Comparison of XeF2 and F-atom Reactions with Si and SiO2", Applied Physics Letter, vol. 44, 1129 (1984).

Streller et al., "Selectivity in Dry Etching of Si (100) and XeF2 and VUV Light", Elsevier Science B.V., Applied Surface Science vol. 106 (1996), pp. 341-346.

Vugts et al., "Si/XeF2 Etching: Temperature Dependence", J. Vac. Sci. Technol. A 14(5) (Sep./Oct. 1996), pp. 2766-2774.

Y.K. Fang, et al., The Compatibility of Aluminun Layers on Plasma-Deposited W and WSi2 Films, , 1988 IEEE, IEEE Transactions on Electron Devices, vol. 35, No. 5, May 1988.

Winters, H.F., "Etch Products from the Reaction of XeF2 with SiO2, SiO3, Si3N4, SiC, and Si in the Presence of Ion Bombardment", J. Vac. Sci. Technol. B 1(4) (Oct./Dec. 1983), pp. 927-931.

Winters et al., "The Etching of Silicon with XeF2 Vapor", Appl. Phys. Letter, vol. 34(1) (Jan. 1, 1979), pp. 70-73.

XACTIX, Inc., Marketing Brochure (Jun. 27, 1999).

"Xenon Difluoride Isotropic Etch System: Seeing is Believing", Surface Technology Systems Ltd. brochure, Newport, UK date unknown.

Assorted promotional literature, Surface Technology Systems Ltd., Newport, UK (Jul. 28, 1999).

Kurt Williams, Etch Rates for Micromachining Processing-Part II, 2003 IEEE, pp. 761-778, Journal of Microelectromechanical Systems, vol. 12, No. 6, Dec. 2003.

G.J. van Gurp, et al., Aluminum-silicide reactions. il. Diffusion, compound formation, and microstructure, 1979 American Institute of Physics, pp. 6915-6922.

J. Baglin, et al., An Alternative marker experiment in the formation of Mo and W silicides, 1978 American Institute of Physics. pp. 289-290.

M. Bartur, et al., Electrical characteristics of Al contact to NiSi using thin W layer as a barrier,, 1981 American Institute of Physics, pp. 822-824.

Krishna C. Saraswat, et al., Properties of Low-Pressure CVD Tungsten Silicide for MOS VLSI Interconnections, 1983 IEEE, pgs.

F. Mohammadi, et al., Properties of Sputtered Tungsten Silicide for MOS Integrated Circuit Applications. pp. 450-454.

Anderson, H.M., "Plasma Diagnostics for Semiconductor Processing", 2000 Digest of the LEOS Topical Meetings (Jul. 24-28, 2000), pp. 117-118 (abstract only).

Baryshev et al., "Monitoring of XiO2/Si Plasma Etching and End-Point Detection", Mikroelektronika (Russia), vol. 25, No. 5 (Sep./Oct. 1996), pp. 373-379 (abstract only).

Bassom et al., "Modeling and Optimizing XeF2-enhanced FIB Milling of Silicon", 25th International Symposium for Testing and Failure Analysis, Santa Clara, CA (Nov. 14-18, 1999), pp. 255-261 (abstract only).

Berg et al., "Real-Time Control of Etching Processes: Experimental Results", Proceedings of the SPIE—The International Society of Optical Engineering, vol. 3213 (1997), pp. 249-260 (abstract only).

Chambers et al., "Endpoint Uniformity Sensing and Analysis in Silicon Dioxide Plasma Etching Using In Situ Mass Spectrometry", J. Vac. Sci. Technol. B, Microelectron. Nanometer Struct., vol. 16, No. 6 (Nov./Dec. 1998), pp. 2996-3002 (abstract only).

Chan et al., "Gas Phase Pulse Etching of Silicon for MEMS with Xenon Difluoride", Engineering Solutions for the Next Millenium: 1999 IEEE Canadian Conference on Electrical and Computer Engineering, Edmonton, Alberta, vol. 3 (May 9-12, 1999), pp. 1637-1642 (abstract only).

Chang et al., "Gas-Phase Silicon Micromachining with Silicon Difluoride", Proceedings of the SPIE—The International Society for Optical Engineering, vol. 2641 (1995), pp. 117-128 (abstract only).

Chen et al., "Spatially Resolved Endpoint Detector for Plasma Etcher", 1997 IEEE International Symposium on Semiconductor Manufacturing Conference Proceedings, San Francisco, CA (Oct. 6-8, 1997), pp. B45-B48 (abstract only).

Chu et al., "Controlled Pulse-Etching with Xenon Difluoride", International Solid State Sensors and Actuators Conference (Transducers '97), Chicago, IL, vol. 1 (Jun. 16-19, 1997), pp. 665-668 (abstract only).

Heinrich et al., "Multichannel Process Monitor for Real-Time Film Thickness and Rate Measurements in Dry Etching and Deposition", Vacuum, vol. 51, No. 4 (Dec. 1998), pp. 497-502 (abstract only).

Kohler et al., "Fabrication of Microlenses by Plasmaless Isotropic Etching Combined with Plastic Moulding", Sens. Actuators A, Phys. (Switzerland), vol. A53, No. 1-3 (May 1996), pp. 361-363 (abstract only).

Li et al., "Mass Spectrometric Measurements on Inductively Coupled Fluorocarbon Plasmas: Positive Ions, Radicals and Endpoint Detection", J. Vac. Sci. Technol. A, Vac. Surf. Films, vol. 17, No. 5 (Sep. 1997), pp. 2348-2446 (abstract only).

Liamanond et al., "Production Data Based Optimal Etch Time Control Design for a Reactive Ion Etching Process", IEEE Trans. Semicond. Manuf., vol. 12, No. 1 (Feb. 1999), pp. 139-147 (abstract only).

Litvak, H.E., "End Point Control Via Optical Emisson Spectroscopy", J. Vac. Sci. Technol. B, Microelectron. Nanometer Struct., vol. 14, No. 1 (Jan./Feb. 1996), pp. 516-520 (abstract only).

Lu et al., "Effluent Monitoring with FTIR Spectroscopy for Low Open Area Oxide Etch Endpoint Detection", 8th International Symposium on Semiconductor Silicon, San Diego, CA, vol. 2 (May 4-8, 1998), pp. 1250-1261 (abstract only).

Maynard et al., "Plasma Etching of Submicron Devices: In Situ Monitoring and Control by Multi-Wavelength Ellipsometry", Thin Solid Films (Switzerland), vol. 313-314, No. 1-2 (Feb. 1998), pp. 398-405 (abstract only).

Melville et al., "Volatile Products and Endpoint Detection in Reactive Ion Etching of III-V Compounds with a Broad Beam ECR Source", Nuclear Instruments & Methods in Physics Research, Section B (Beam Interactions with Materials and Atoms), vol. B106, No. 1-4 (Dec. 1995), pp. 179-182 (abstract only).

Muthukumaran et al., "Gas-Phase Xenon Difluoride Etching of Microsystems Fabricated Through the Mitel 1.5mu m CMOS Process", Can. J. Electr. Comput. Eng. (Canada), vol. 25, No. 1 (Jan. 2000), pp. 35-41 (abstract only).

Perrin, J., "Mass Spectrometry of Reactive Plasmas", Plasma Processing of Semiconductors, Chateau de Bonas, France (Jun. 17-28, 1996), pp. 397-431 (abstract only).

Richter et al., "Exhaust Gas Monitoring: New Window Into Semiconductor Processing", Solid State Technol., vol. 42, No. 5 (May 1999), pp. 61, 63-64, 68, 70-71 (abstract only).

Saito et al., "Low Temperature Plasmaless Etching of Silicon Dioxide Film Using Chlorine Trifluoride Gas with Water Vapor", J. Electrochem. Soc., vol. 147, No. 12 (Dec. 2000), pp. 4630-4632 (abstract only).

Sebel et al., "Etching of Si Through a Thick Condensed XeF2 Layer", J. Vac. Sci. Technol. A, Vac. Surf. Films, vol. 18, No. 5 (Sep./Oct. 2000), pp. 2090-2097 (abstract only).

Sebel et al., "Reaction Layer Dynamics in Ion-Assisted Si/XeF2 Etching: Temperature Dependence", J. Vac. Sci. Technol. A, Vac. Surf. Films, vol. 18, No. 6, (Nov. 2000), pp. 2759-2769 (abstract only).

Sebel et al., "Silicon Etch Rate Enhancement by Traces of Metal", J. Vac. Sci. Technol. A, Vac. Surf. Films, vol. 17, No. 3, (May/Jun. 1999), pp. 755-762 (abstract only).

Sugano et al., "Study of XeF2 Pulse Etching Using Wagon Wheel Pattern", Proceedings of the 1999 International Symposium on Micromechantronics and Human Science: Towards the New Century, Nagoya, Japan (Nov. 23-26, 1999), pp. 163-167 (abstract only).

Sun et al., "Sensitive Plasma Etching Endpoint Detection Using Tunable Diode Laser Absorption Spectroscopy", Appl. Phys. Lett., vol. 64, No. 21 (May 23, 1994), pp. 2779-2781 (abstract only).

Thomas et al., "Minimized Response Time of Optical Emission and Mass Spectrometric Signals for Optimized Endpoint Detection", J. Vac. Sci. Technol. B, Microelectron. Nanometer Struct., vol. 14, No. 4 (Jul./Aug. 1996), pp. 2531-2536 (abstract only).

Toda et al., "Thin Beam Bulk Micromachining Based on RIE and Xenon Difluoride Silicon Etching", International Solid State Sensors and Actuators Conference (Transducers '97), Chicago, IL, vol. 1 (Jun. 16-19, 1997) pp. 671-674.

Vugts et al., "Si/XeF2 Etching: Reaction Layer Dynamics and Surface Roughening", J. Vac. Sci. Technol. A, Vac. Surf. Films, vol. 14, No. 5 (Sep./Oct. 1996), pp. 2780-2789 (abstract only).

Vugts et al., "Si/XeF2 Etching: Temperature Dependence", J. Vac. Sci. Technol. A, Vac. Surf. Films, vol. 14, No. 5 (Sep./Oct. 1996), pp. 2766-2774 (abstract only).

Wan et al., "Electron Cyclotron Resonance Plasma Reactor for SiO2 Etching: Process Diagnostics, End-Point Detection, and Surface Characterization", J. Vac. Sci. Technol. A, Vac. Surf. Films, vol. 13, No. 4 (Jul./Aug. 1995), pp. 2035-2043 (abstract only).

Wang et al., "Gas-Phase Silicon Etching with Bromine Trifluoride", International Solid State Sensors and Actuators Conference (Transducers '97), Chicago, IL, vol. 2 (Jun. 16-19, 1997), pp. 1505-1508 (abstract only).

Ward, P.P., "Plasma Process Control with Optical Emission Spectroscopy", 17th IEEE/CPMT International Electronics Manufacturing Technology Symposium: Manufacturing Technologies—Present and Future, Austin, TX (Oct. 2-4, 1995), pp. 166-169 (abstract only).

Warneke, et al., "In Situ Characterization of CMOS Post-Process Micromachining", Sens. Actuators A, Phys. (Switzerland), vol. A89, No. 1-2 (Mar. 20, 2001), pp. 142-151 (abstract only).

Welch et al., "Breaking the 0.5 Percent Exposed Area Etch Endpoint Barrier", Semicond. Int., vol. 19, No. 8 (Jul. 1996), pp. 269-270, 272, 274, 276 (abstract only).

Wodecki, N.D., Low Open Area Multi-Layered Dielectric Film Etch Endpoint Detection Using EndPoint Plus (TM), Proceedings of the SPIE—The International Society for Optical Engineering, vol. 3882 (1999), pp. 231-238 (abstract only).

Wong et al., "Endpoint Prediction for Polysilicon Plasma Etch Via Optical Emission Interferometry", J. Vac. Sci. Technol. A, Vac. Surf. Films, vol. 15, No. 3, Pt. 2 (May/Jun. 1997), pp. 1403-1408 (abstract only).

Yue et al., "Plasma Etching Endpoint Detection Using Multiple Wavelengths for Small Open Area Wafers", J. Vac. Sci. Technol. A, Vac. Surf. Films, vol. 19, No. 1 (Jan. 2001), pp. 66-75 (abstract only).

Aliev et al., "Development of Si(100) Surface Roughness at the Initial Stage of Etching in F2 and XeF2 Gases Ellipsometric Study", Surface Science 442 (1999), pp. 206-214.

Glidemeister, J.M., "Xenon Difluoride Etching System" (Nov. 17, 1997).

Habuka et al., "Dominant Overall Chemical Reaction in a Chlorine Trifluoride-Silicon-Nitrogen System at Atmospheric Pressure", Japan Journal of Applied Physics vol. 38 (1999), pp. 6466-6469.

Hecht et al., "A Novel X-ray Photoelectron Spectroscopy Study of the Al/SiO2 Interface", J. Appl. Phys. vol. 57 (Jun. 15, 1985), pp. 5256-5261.

Houle, F.A., "Dynamic of SiF4 Desorption During Etching of Silicon by XeF2", IBM Almaden Research Center (Apr. 15, 1987), pp. 1866-1872.

Flamm et al., "XeF2 and F-Atom Reactions with Si: Their Significance for Plasma Etching", Solid State Technol. 26, 117 (1983).

Ibbotson et al., "Plasmaless Dry Etching of Silicon with Fluorine-containing Compounds", J. Appl. Phys. vol. 56 No. 10 (Nov. 1984), pp. 2939-2942.

Ibbotson et al., "Comparison of XeF2 and F-atom Reactions with Si and SiO2", Applied Physics Letter, vol. 44, 1129 (1984).

Streller et al., "Selectivity in Dry Etching of Si (100) and XeF2 and VUV Light", Elsevier Science B.V., Applied Surface Science vol. 106 (1996), pp. 341-346.

Vugts et al., "Si/XeF2 Etching: Temperature Dependence", J. Vac. Sci. Technol. A 14(5) (Sep./Oct. 1996), pp. 2766-2774.

Winters, H.F., "Etch Products from the Reaction of XeF2 with SiO2, SiO3, Si3N4, SiC, and Si in the Presence of Ion Bombardment", J. Vac. Sci. Technol. B 1(4) (Oct./Dec. 1983), pp. 927-931.

Kurt Williams, Etch Rates for Micromachining Processing-Part II, 2003 IEEE, pp. 761-778, Journal of Microelectromechanical Systems, vol. 12, No. 6, Dec. 2003.

Winters et al., "The Etching of Silicon with XeF2 Vapor", Appl. Phys. Letter, vol. 34(1) (Jan. 1, 1979), pp. 70-73.

XACTIX, Inc., Marketing Brochure (Jun. 27, 1999).

"Xenon Difluoride Isotropic Etch System: Seeing is Believing", Surface Technology Systems Ltd. brochure, Newport, UK, date unknown.

Chu et al., "Controlled Pulse-Etching with Xenon Difluoride", International Solid State Sensors and Actuators Conference (Transducers '97), Chicago, IL, vol. 1 (Jun. 16-19, 1997), pp. 665-668 (abstract only).

Bassom et al., "Modeling and Optimizing XeF2-enhanced FIB Milling of Silicon", 25th International Symposium for Testing and Failure Analysis, Santa Clara, CA (Nov. 14-18, 1999), pp. 255-261 (abstract only).

Kohler et al., "Fabrication of Microlenses by Plasmaless Isotropic Etching Combined with Plastic Moulding", Sens. Actuators A, Phys. (Switzerland), vol. A53, No. 1-3 (May 1996), pp. 361-363 (abstract only).

Chan et al., "Gas Phase Pulse Etching of Silicon for MEMS with Xenon Difluoride", Engineering Solutions for the Next Millenium: 1999 IEEE Canadian Conference on Electrical and Computer Engineering, Edmonton, Alberta, vol. 3 (May 9-12, 1999), pp. 1637-1642 (abstract only).

Chang et al., "Gas-Phase Silicon Micromachining with Silicon Difluoride", Proceedings of the SPIE—The International Socity for Optical Engineering, vol. 2641 (1995), pp. 117-128 (abstract only).

Sebel et al., "Reaction Layer Dynamics in Ion-Assisted Si/XeF2 Etching: Temperature Dependence", J. Vac. Sci. Technol. A, Vac. Surf. Films, vol. 18, No. 6, (Nov. 2000), pp. 2759-2769 (abstract only).

Sebel et al., "Silicon Etch Rate Enhancement by Traces of Metal", J. Vac. Sci. Technol. A, Vac. Surf. Films, vol. 17, No. 3, (May/Jun. 1999), pp. 755-762 (abstract only).

Sugano et al., "Study on XeF2 Pulse Etching Using Wagon Wheel Pattern", Proceedings of the 1999 International Symposium on Micromechantronics and Human Science: Towards the New Century, Nagoya, Japan (Nov. 23-26, 1999), pp. 163-167 (abstract only).

Wang et al., "Gas-Phase Silicon Etching with Bromine Trifluoride", International Solid State Sensors and Actuators Conference (Transducers '97), Chicago, IL, vol. 2 (Jun. 16-19, 1997), pp. 1505-1508 (abstract only).

Muthukumaran et al., "Gas-Phase Xenon Difluoride Etching of Microsystems Fabricated Through the Mitel 1.5-mu m CMOS Process", Can. J. Electr. Comput. Eng. (Canada), vol. 25, No. 1 (Jan. 2000), pp. 35-41 (abstract only).

Toda et al., "Thin Beam Bulk Micromachining Based on RIE and Xenon Difluoride Silicon Etching", International Solid State Sensors and Actuators Conference (Transducer '97), Chicago, IL, vol. 1 (Jun. 16-19, 1997), pp. 671-674.

Sebel et al., "Etching of Si Through a Thick Condensed XeF2 Layer", J. Vac. Sci. Technol. A, Vac. Surf Films, vol. 18, No. 5 (Sep./Oct. 2000), pp. 2090-2097 (abstract only).

Winters, H.F., "Etch Products from the Reaction of XeF2 with SiO2, SiO3, Si3N4, SiC, and Si in the Presence of Ion Bombardment", J. Vac. Sci. Technol. B 1(4) (Oct./Dec. 1983), pp. 927-931.

Winters et al., "Etching of Silicon with XeF2 Vapor", Appl. Phys. Letter, vol. 34(1) (Jan. 1, 1979), pp. 70-73.

XACTIX, Inc., Marketing Brochure (Jun. 27, 1999).

"Xenon Difluoride Isotropic Etch System: Seeing is Believing", Surface Technology Systems Ltd. brochure, Newport, UK, date unknown.

Assorted promotional literature, Surface Technology Systems Ltd., Newport, UK (Jul. 28, 1999).

Kurt Williams, Etch Rates for Micromachining Processing-Part II, 2003 IEEE, pp. 761-778, Journal of Microelectromechanical Systems, vol. 12, No. 6, Dec. 2003.

G.J. van Gurp, et al., Aluminum-silicide reactions. il. Diffusion, compound formation, and microstructure, 1979 American Institute of Physics, pp. 6915-6922.

J. Baglin, et al., An Alternative marker equipment in the formation of Mo and W silicides, 1978 American Institute of Physics. pp. 289-290.

M. Bartur, et al., Electrical characteristics of Al contact to NiSi using thin W layer as a barrier,, 1981 American Institute of Physics, pp. 822-824.

Krishna C. Saraswat, et al., Properties of Low-Pressure CVD Tungsten Silicide for MOS VLSI Interconnections, 1983 IEEE, pgs.

F. Mohammadi, et al., Properties of Sputtered Tungsten Silicide for MOS Integrated Circuit Applications. pp. 450-454, date not available.

* cited by examiner

FIG. 6

MICROELECTROMECHANICAL STRUCTURE AND A METHOD FOR MAKING THE SAME

CROSS-REFERENCE TO RELATED APPLICATIONS

This application is a continuation-in-part of 1) U.S. patent application Ser. No. 10/402,789 to Patel et al, filed Mar. 28, 2003, now U.S. Pat. No. 6,849,471, the subject matter being incorporated herein by reference.

TECHNICAL FIELD OF THE INVENTION

The present invention is related generally to microelectromechanical systems, and, more particularly, to materials used for structures of micromirrors of spatial light modulators and methods for releasing the micromirrors using spontaneous gas phase chemical etchants.

BACKGROUND OF THE INVENTION

The present invention relates to microstructures, such as reflective micromirrors and micromirror arrays of spatial light modulators used in digital displays systems. A typical micromirror operates in binary states—an ON state and an OFF state. In digital display applications, each micromirror is associated with a pixel of an image. At a time when the pixel is "bright", a micromirror is set to the "ON" state. Incident light from a light source of the system is reflected by the micromirror in the ON state into a cone of reflected light so as to generate a "bright" pixel on a display target of the system. At another time when the pixel of the image turns to "dark", the micromirror is switched to the "OFF" state. The incident light is reflected into another cone of reflected light so as to generate a "dark" pixel on the display target.

The ON state and the OFF state of the micromirrors are defined by rotation angles of movable mirror plates of the micromirrors, which have hinges for allowing rotation of the mirror plates. By rotating the mirror plates between the rotation angles, the micromirrors are switched between the ON state and the OFF state, resulting in "bright" and "dark" pixels on the display target. Grayscale images can be produced by the micromirrors using pulse-width-modulation techniques, and color images can be achieved by the micromirrors using sequential-color-display techniques.

Regardless of the different applications, properties, such as mechanical and electrical properties of the structures of the micromirrors are among those determinative factors affecting the performance of the micromirrors in the applications.

SUMMARY OF THE INVENTION

In an embodiment of the invention, an etching method is disclosed. The method comprises: loading a workpiece into an etching chamber, the workpiece comprising a first area to be removed by a spontaneous vapor phase chemical etchant and a second area to remain after the first area being removed, wherein the second area comprises an intermetallic compound; providing the spontaneous vapor phase etchant to the etching chamber; and removing the first area while leaving behind the second area.

In another embodiment of the invention, a method is disclosed. The method comprises: forming a microstructure, comprising: providing a substrate; depositing a first and second sacrificial layer on the substrate; and forming a first and second structural layers on the sacrificial layers, wherein at least one of the two structural layers comprises an intermetallic compound; loading the microstructure to an etching chamber; and removing the sacrificial layers using a spontaneous vapor phase chemical etchant.

In yet another embodiment of the invention, a method for making a microstructure is disclosed. The method comprises: depositing a sacrificial material on a substrate, the sacrificial material comprising a metal; depositing a structural layer after depositing the sacrificial material, wherein the structural layer comprises a material other than the sacrificial material, and wherein the structural layer comprises an intermetallic compound; and removing the sacrificial material with a spontaneous vapor phase chemical etchant.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

FIG. 4b is another side-view of the exemplary micromirror of FIG. 4a;

DETAILED DESCRIPTION OF THE EMBODIMENTS

The method of the present invention provides a method for fabricating a microstructure. During the fabrication, a plurality of structural layers are deposited and patterned into desired shapes. Between two adjacent structural layers, a sacrificial layer is deposited and patterned. The microstructure is released by removing the sacrificial layers with the structures left behind.

In the following, embodiment of the present invention will be discussed in detail with reference to a fabrication process for a micromirror device of a spatial light modulator for use in digital display applications. It will be appreciated by those skilled in the art that the following discussion is for demonstration purposes only, and should not be interpreted in any way as a limitation on the present invention. For example, the present invention is applicable to fabrications of other types of microstructures other than micromirrors. Other variations in materials, fabrication processes, and configurations of the microstructures are possible without departing from the spirit of the present invention Referring to FIG. 1, a cross-sectional view of a portion of a micromirror device before release is illustrated therein. In its very basic configuration, the microstructure comprises substrate 120, first sacrificial layer 126, first structural layer 130, second sacrificial layer 134 and second structural layer 138. Layers 128, 132, 136, 140 and 142 are optional layers which will be discussed afterwards.

Figure 1:
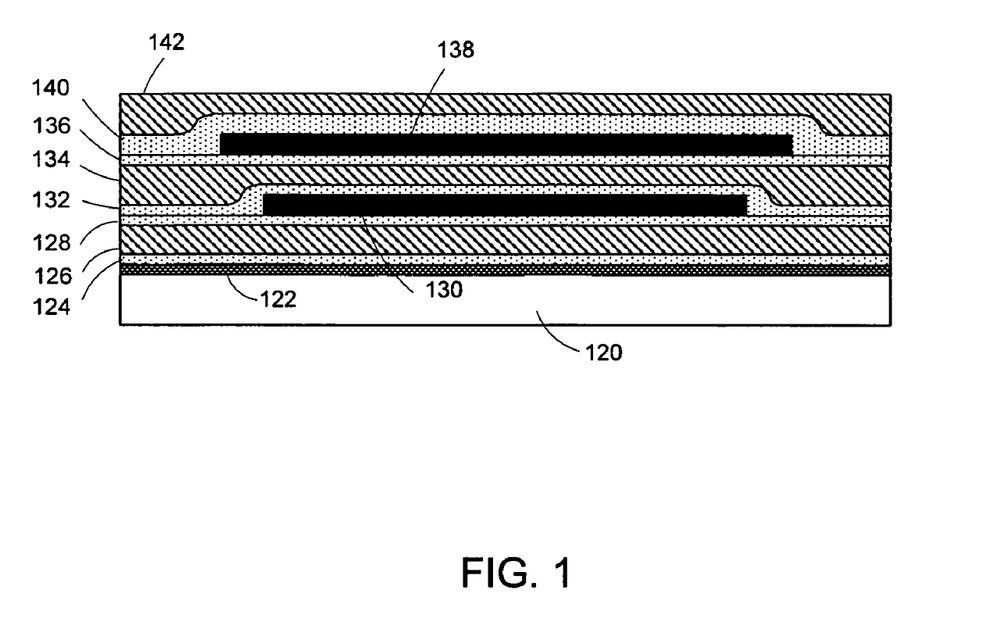
FIG. 1 schematically illustrates a cross-sectional view of a microstructure according to an embodiment of the invention.

In an embodiment of the invention, the substrate is a standard silicon wafer that further comprises an electrode and circuitry formed in layer 122. The second structural layer is a mirror plate layer of the micromirror for reflecting visible light, and the first structural layer 130 is a hinge layer for holding the mirror plate above the substrate such that the mirror plate can rotate relative to the substrate after the sacrificial layers being removed. In this embodiment, layer 124 is a dielectric layer (e.g. $SiO_2$ or $SiN_x$) for protecting the electrode and circuit layer 122.

In another embodiment of the invention, the substrate is transparent to visible light (e.g. 1737F, Eagle 2000, quartz, Pyrex™, sapphire). Layer 130 is a mirror plate for reflecting visible light, and layer 138 is the hinge layer for holding the mirror plate above the substrate such that the mirror plate can rotate relative to the substrate after the sacrificial layers are removed. In this embodiment, the electrode and circuit layer 122 is not formed and the dielectric layer 124 is not deposited.

In either embodiment, the micromirror may comprise other optional layers, such as layers 128, 132, 136, 140 and 142 and other layers (structural layers and/or sacrificial layers, which are not shown in the figure) on layer 142. Specifically, layers 128, 132, 136 and 140 are barrier layers deposited during the fabrication for preventing diffusions and interactions between the sacrificial layers and the structural layers. In particular, barrier layer 128 is deposited on sacrificial layer 126 before deposition of structural layer 130. Barrier layer 132 is deposited on structural layer 130 before depositing sacrificial layer 134. As a result, structural layer 130 is isolated from the sacrificial layers. Similarly, the barrier layers 136 and 140 are deposited immediately before and after the deposition of structural layer 138 such that structural layer 138 is isolated from the sacrificial layers 134 and 142. Of course, barrier layer 140 may not be deposited if sacrificial layer 142 is not provided, which occurs especially when no other structural layers is to be formed on structural layer 138. Meanwhile, it is not an absolute requirement that each structural layer is surrounded by two barrier layers. Instead, a structural layer can be directly deposited on a sacrificial layer without depositing a barrier layer therebetween, especially when the sacrificial material neither diffuses into nor interacts with the structural layer.

Figure 2:
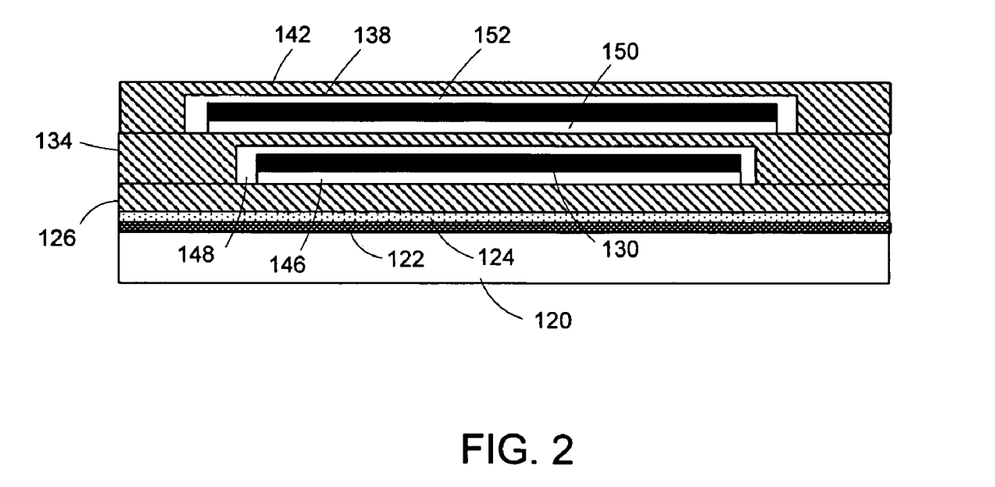
FIG. 2 schematically illustrates a cross-sectional view of another microstructure according to another embodiment of the invention.

The barrier layers can be a layer to be removed with the sacrificial layers such as those illustrated in FIG. 1. During the fabrication, when a barrier layer is to be patterned, it is preferably patterned along with the adjacent sacrificial layer. Alternatively, the barrier layer can be a layer not to be removed with the sacrificial layers and instead, it remains with the structural layers after removing the sacrificial layers as shown in FIG. 2. In this case, the barrier layers are patterned according to the adjacent structural layers.

Although both of the barrier layers in FIG. 1 are removable, and both of the barrier layers in FIG. 2 are non-removable, these are not absolute requirements. In an alternative embodiment, removable and non-removable barrier layers both can be used in one fabrication of a microstructure. Specifically, one or more of the barrier layers between the structural layers and the sacrificial layers are removable barrier layers and the rest of the barrier layers are non-removal barrier layers. During the fabrication process, the removable barrier layer(s) are patterned along with the adjacent sacrificial layers, while the non-removal barrier layer(s) are patterned according to the adjacent structural layers.

According to the invention, the structural layer comprises an intermetallic compound, such as $Ti_xAl_y$, $Ni_xAl_y$, $Ti_xNi_y$, $VAl_x$, $WTe_x$, $TiFe_x$, $TiPd_x$, $AlPd_x$, $MoPd_x$, $MoNi_x$, $MoFe_x$, $CoCr_x$, $CoMn_x$, $NiW_x$, $NiV_x$, $NiTi_xAl_y$, $NbAl_x$, $MoPd_x$, $AlCu_x$, $CuZn_x$, and $TaAl_x$. The intermetallic compound may be composed of an early transition metal. The early transition metals are those elements in the periodic table in columns 3 through 7, namely columns beginning with Sc, Ti, V, Cr, and Mn. Preferred are those elements in columns 4 through 6 (i.e. Ti, Zr, Hf, V, Nb, Ta, Cr, Mo, and W), and elements Tc and Re in column 7. However late transition metals in columns 8, 9 and 10 (e.g. Ru, Os, Rh, Ir, and Pt) may also be possible in the present invention. Of course, selected metals, such as Al is also applicable. Other structural materials may comprise materials that are predominantly intermetallic compounds that are further strengthened by addition of one or more strengthen materials, such as O and N. In this situation, the structural material comprises at least 60 atomic % or more, or 80 atomic % or more, or 90 atomic % or more, or 95 atomic % or more of the intermetallic material. It is further preferred that the intermetallic compound comprises a transition metal.

The sacrificial material for the sacrificial layers is preferably selected from the group consisting of elemental early transition metal, metal alloy, metalloid, metal silicide and other suitable materials such as $WN_x$ and $TaN_x$. Preferred early transition metals are those elements in columns 4 through 6 (i.e. Ti, Zr, Hf, V, Nb, Ta, Cr, Mo and W). Exemplary metal alloys for the sacrificial layers are $W_xTa$, $W_xTi$, $W_xMo$ and $W_xCr$. Exemplary metalloids for the sacrificial layers are Si, Ge and SiGe. Exemplary metal silicides for the sacrificial layers are $WSi_x$, $TiSi_x$, $MoSi_x$, $ZrSi_x$, $CrSi_x$, $TaSi_x$ and $TiWSi_x$. Most preferred materials are Ti, Si, W, WN and compounds or alloys thereof.

For a barrier layer to be removed along with the sacrificial layers, it is preferred that (1) the barrier material of the barrier layer neither diffuses into nor interacts with the adjacent structural layer(s); and (2) the barrier material is removable by the chemical etchant for removing the sacrificial layers. Such barrier material can be selected from the materials for the sacrificial layers as discussed above.

For a barrier layer not to be removed during the removal of the sacrificial layers and remain after the removal of the sacrificial layers, it is preferred that (1) the barrier material of the barrier layer neither diffuses into nor interacts with the adjacent structural layer(s); and (2) the barrier material is non-removable by the chemical etchant for removing the sacrificial layers. Such barrier material can be selected from the materials for the structural layers as discussed above.

After all structural layers are deposited and patterned according to the desired configuration, the sacrificial layers and the removable barrier layers are removed using a spontaneous vapor phase chemical etchant. According to the invention, the etchant is selected from a group comprising interhalogen (e.g. bromine trifluoride), noble gas halide (e.g. xenon difluoride) and HF, and more preferably xenon difluoride. It is further preferred that the chemical etchant is mixed with a diluent gas, which is preferably an inert gas selected from $N_2$, He, Ne, Ar, Kr, and Xe, and more preferably He and $N_2$, as set forth in U.S. patent application Ser. No. 09/427,841 to Patel, filed Oct. 26, 1999; Ser. No. 09/649,569 to Patel, filed Aug. 28, 2000; and Ser. No.

10/269,149 to Patel, filed Oct. 12, 2002, the subject matter of each being incorporated herein by reference.

Figure 3:
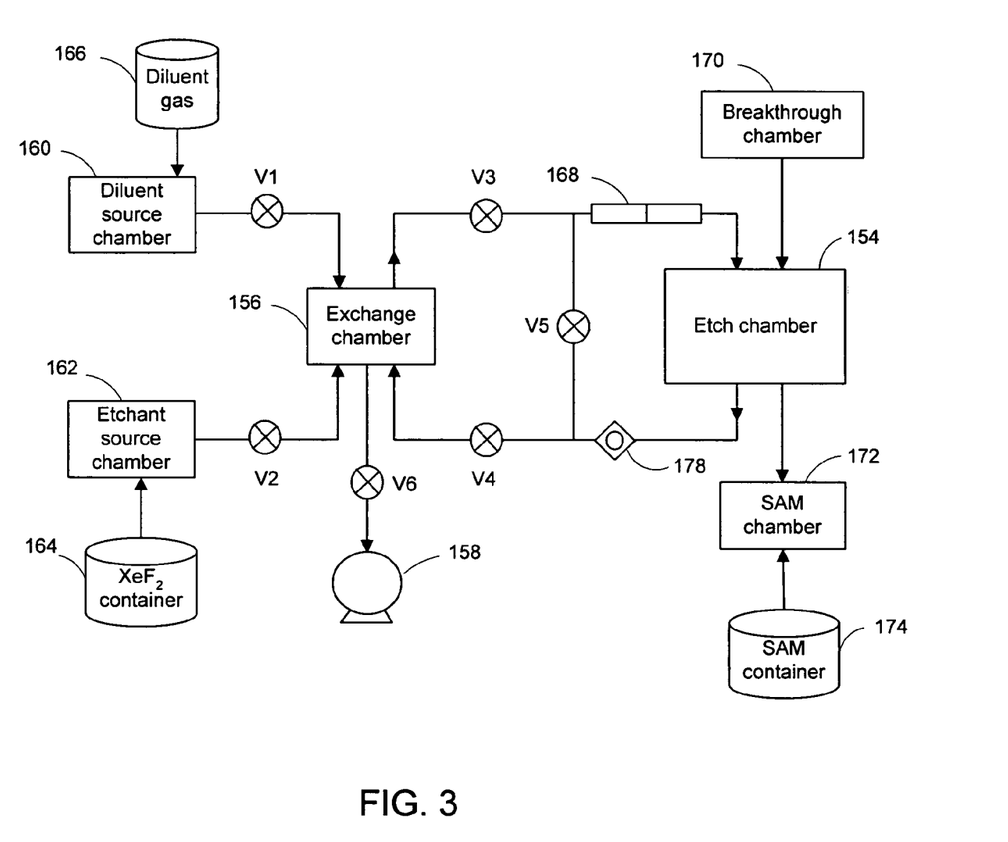
FIG. 3 is a block diagram schematically illustrating an etching systems for releasing the microstructure by removing the sacrificial material of the microstructure.

In the following, an exemplary etching process for the microstructure will be discussed with reference to an etching system as shown in FIG. 3. It will be understood that the following discussion is for demonstration purposes only. Other etching processes and systems may be applicable. Referring to FIG. 3, the etching system comprises etch chamber 154 and exchange chamber 156. The etch chamber contains the microstructure (e.g. micromirror) having a sacrificial material (e.g. amorphous silicon) to be removed. A chemical etchant that reacts with the sacrificial material and generate reaction products in vapor phase that can be evacuated from the etching system is selected. In the embodiment of the invention, the etchant is selected from a group comprising interhalogens, noble gas halides and HF. In particular, when the sacrificial material is amorphous (or porous) silicon, xenon difluoride is selected as the etchant. The spontaneous vapor phase $XeF_2$ is mixed with a diluent gas to form an etchant recipe in the exchange chamber. In the embodiment of the invention, the diluent gas is preferably an inert gas, such as nitrogen, helium, argon, krypton, neon or xenon or a mixture of one or more inert gases, and more preferably an inert gas having a large collision diameter and large molar weight. The cubic volume of the exchange chamber is preferably much less than (e.g. around one twentieth of or one fiftieth of) the cubic volume of the etch chamber such that the amount of the mixed gas of $XeF_2$ and the diluent gas is smaller than the mixed gas (including the etchant, the diluent gas and the etching products) in the etch chamber. As a result, the feeding of the mixed gas into the etch chamber during one feeding cycle does not dramatically change the etching process, such as the etching rate inside the etch chamber.

The exchange chamber, the etch chamber and valve V3, circulation pump 168, valve V4 and detector 178 form the outer circulation loop illustrated as a dotted line. The etch chamber, circulation pump 168, valve V5 and detector form the inner circulation loop as illustrated in another dotted line. The arrows in the figure represent the flow direction of the mixed gases within the etching system. Of course, the flow directions can be reversed, as long as all flow directions within each segment of the flow path are reversed. The circulation pump 168 continuously pumps the gases passing by so as to maintain the circulation via the two loops. The detector dynamically measures the concentration of a reaction product such as $SiF_4$ gas. The measured concentration is then analyzed by the processing unit to obtain the progress information on the etching process inside the etch chamber. In the embodiment of the invention, the detector is a MKS Process Sense that uses Infra-Red light to detect the reaction products. Other detectors, such as a Residual Gas Analyzer from AMTEK may also be employed.

Valves V3, V4 and V5 switch the circulation via the inner circulation loop and the outer circulation loop. Specifically, the outer circulation is activated by opening (e.g. allowing the gas to flow through) the valves V3 and V4, and closing (e.g. blocking the gas to flow through) valve V5. The inner circulation loop is activated by opening valve V5 and closing valves V3 and V4.

The exchange chamber is further connected to diluent source chamber 160 via valve V1, and the diluent source chamber is connected to diluent gas cylinder 166. In addition to the diluent source chamber, the exchange chamber is also connected to etchant source chamber 162 via valve V2 and pump 107 via valve V6. The etchant source chamber is further connected to the etchant gas container, such as $XeF_2$ container 164.

The etching process begins with filling the exchange chamber and the etch chamber with the helium gas that has a pressure preferably of from 1 to 700 torr, and more preferably from 20 to 500, and more preferably from 20 to 100 torr, as long as the mean-free-path of the diluent gas is equal to or less than the minimum size of the gap within the microstructure. This filling step is achieved by opening valves V1, V3, V4, V5 and closing valves V2 and V6 for a time period, preferably around 500 milliseconds until the diluent gas inside the etching system reaches equilibrium. The exchange chamber is then pumped out so as to reduce the pressure inside exchange chamber and meanwhile, circulating the diluent gas through the inner loop for a time period preferably from 100 to 1500 milliseconds. This step is accomplished by opening valve V5 and valve V6 and closing valves V1, V2, V3 and V4. As a result, the pressure inside the exchange chamber is reduced to a pressure of from 1 to 15 torr, while the pressure inside etch chamber 106 is maintained at its initial pressure. Because the pressure of the exchange chamber is equal to or below the pressure of $XeF_2$ inside etchant source chamber 102, $XeF_2$ can thus flow into the exchange chamber by opening valve V2 and closing valves V1, V3, V4 and V6. At this step, valve V5 is left open—allowing the diluent gas to keep on circulating via the inner circulation loop.

At the point, an etchant recipe having the etchant gas and the diluent gas is prepared. The partial pressure of the etchant gas is preferably of from 1 to 15 torr, and more preferably around 4 torr. A ratio of the partial pressure of the etchant gas to the partial pressure of the diluent gas is from 1/1000 to 1/100, and more preferably from 6/100 to 4/200. During this step, a first amount of $XeF_2$ flows into the exchange chamber. The amount may be controlled by the duration of opening valve V2. Alternatively the amount can be controlled through controlling the duration of the opening of valve V6. For example, by controlling the open duration of valve V6, the pressure of the gas left inside the exchange chamber can be set to a desired pressure value, such as 1 torr, 2 torr and 3 torr, wherein the desired pressure corresponds to the desired additional amount of $XeF_2$ to be filled into the exchange chamber. For example, when the pressure of the gas inside the exchange chamber is set to 1 torr, an additional amount of $XeF_2$ corresponding to 3 torr (3 torr=4 torr−1 torr) is fed into the exchange chamber when valve V2 is opened. In the embodiment of the invention, the duration of opening valve V2 is preferably around 500 milliseconds. The helium diluent gas mixes with the $XeF_2$ etchant gas and reaches equilibrium. This step is accomplished by opening valve V1 and closing valves V2, V3, V4 and V6 for a time duration preferably around 100 milliseconds. After the $XeF_2$ gas is mixed with the helium gas, the mixed gas is then fed into etch chamber 106. This feeding step is accomplished by opening valve V3 and valve V4 and closing the rest of the valves, including valves V1, V2, V5, and V6. It can be seen that, by closing valve V5 and opening valves V3 and V4, the inner circulation loop is closed and the outer circulation loop is opened. As a result, the mixed gas flows via the outer circulation loop and passes through the etch chamber for etching the amorphous silicon through the chemical reaction inside the etch chamber. This step may last for a time period, preferably from 1000 to 3000 milliseconds, depending upon the measurement result of the detector 109.

After the feeding of the first amount of the etchant recipe into the etch chamber, additional etchant recipes maybe fed into the etch chamber to maintain a constant etching rate of the sacrificial material. The timing for feeding the additional amount of the etchant recipe can be determined in many ways. In an embodiment of the invention, the additional etchant recipes are fed according to a sequence of feeding cycles. An amount of the etchant recipe is fed into the etch chamber during a time slot in each feeding cycle.

For example, during the first time slot of the first feeding cycle, a first amount of the selected etchant recipe is fed into the etch chamber. The etchant recipe then chemically reacts with the sacrificial material—resulting reaction products, also in gas phase. The chemical reaction consumes the selected etchant of the etchant recipe and decreases the amount of the etchant inside the etch chamber. This decrease slows down and may even stop the chemical reaction within the etch chamber before all sacrificial materials are removed. Therefore, a second amount of the selected etchant is fed into the etch chamber during the second time slot of the second feeding cycle. For the same reason, a third amount of the selected etchant is fed into the etch chamber during the third time slot of the third feeding cycle, if the sacrificial material within the etch chamber is not removed. The feed process continues until all sacrificial materials are removed or in practice, the amount of the sacrificial material inside the etch chamber is below a predefined value. The durations of the feeding cycles and time intervals between adjacent feeding cycles may or may not be the same. Instead, the duration of the feeding cycles, and the time interval between adjacent time slots are individually adjustable. This benefits the control of the etching rate (e.g. defined as the amount of sacrificial materials removed through the chemical reaction per second) through out the etching process. In an embodiment of the invention in which $XeF_2$ is used as the etchant for removing amorphous silicon in micromirror devices, the etching rate is preferably from 10 to 50 angstroms per second, more preferably from 20 to 30 angstroms per second, and more preferably around 20 angstroms per second.

In another embodiment of the invention, additional etchant recipes are fed into the etch chamber based on a measurement of the detector. For example, the detector dynamically measures the concentration of the etchant inside the etch chamber. Whenever a decrease of the concentration is observed, an additional amount of the etchant is fed into the etch chamber so as to maintain a constant concentration of the etchant within the etch chamber. As a result, a constant etch rate can be obtained.

When the concentration of the etchant can not be measured precisely, the detector can measure the concentration of an etch product, such as $SiF_4$ using Infra-Red light. In this case, the derivative ($dC_{SiF4}$/dt) is real-timely calculated by the data processing unit. These parameters are then used to derive the surface area of the amorphous silicon so as to determine whether the surface area changes. If the surface area changes, an additional amount of the etchant recipe is prepared and fed into the etch chamber.

After the sacrificial material and removal barrier layers are removed, structural layers and non-removal barrier layers remain. The etching process is terminated and the microstructure can be unloaded from the etch chamber. Other optional processes, such as coating the microstructure with self-assembly-monolayer (SAM) material, can then be performed. Specifically, the etch chamber is pumped out to remove the gases from inside the etch chamber. The microstructure is unloaded from the etch chamber and transferred into the SAM chamber (SAM chamber 172 in FIG. 3). The SAM chamber is then filled with the SAM material so as to coat the microstructure with the SAM material at step. After the coating, the microstructure is unloaded from the SAM chamber. In transferring the microstructure from one chamber (e.g. the etchant chamber) to another (e.g. the SAM chamber), a load-lock that connects the chambers is preferably employed. During a transfer from one chamber to another, the microstructure is unloaded from the first chamber and loaded into the load-lock before loading the microstructure into the second chamber.

In addition to SAM coating process, breakthrough etch may also be applied to the microstructure. Specifically, the breakthrough etch for removing the non-spontaneously-etchable films on the sacrificial materials is performed at breakthrough chamber 170 (in FIG. 3) before etching the microstructure using spontaneous vapor phase $XeF_2$. After the completion of the breakthrough etch, the microstructure is unloaded from the breakthrough chamber and transferred into the etch chamber.

Figure 4A:
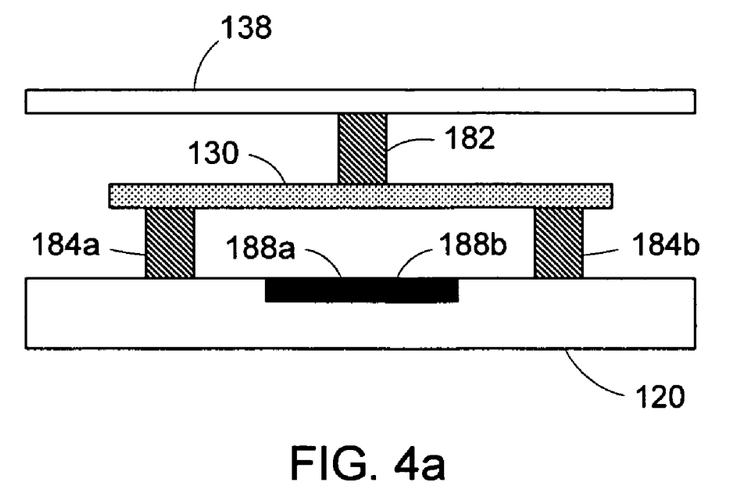
FIG. 4a is a side-view of an exemplary micromirror fabricated according to the embodiment of the present invention.
Figure 4B:
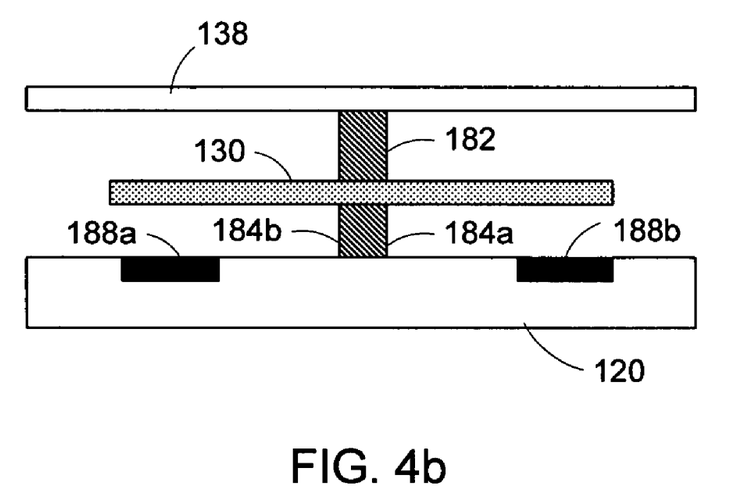

As an example, FIG. 4a and FIG. 4b illustrate a micromirror as discussed above with reference to FIG. 1, in which substrate 120 is a silicon wafer, structural layer 130 is the hinge and structural layer 138 is the mirror plate. Referring to FIG. 4a, the micromirror is formed on the silicon wafer 120 that further comprises electrodes 188a and 188b (which are overlapped in the cross-sectional view of FIG. 4a). The silicon wafer further comprises a circuit (not shown) for controlling the voltage level of the electrodes. Hinge 130 is formed above and connected to the silicon wafer via two posts 184a and 184b. Mirror plate 138 is connected to the hinge via post 182. In operation, voltages determined by the circuit are applied to the electrodes, and electrostatic fields are established between the mirror plate and the electrodes. In response to the electrostatic fields, the mirror plate rotates relative to the substrate for reflecting light into desired directions.

FIG. 4b illustrates another cross-sectional view of the micromirror. In this cross-sectional view, posts 184a and 184b are overlapped. The two electrodes 188a and 188b are disposed on either side of the mirror plate for rotating the mirror plate.

Figure 5:
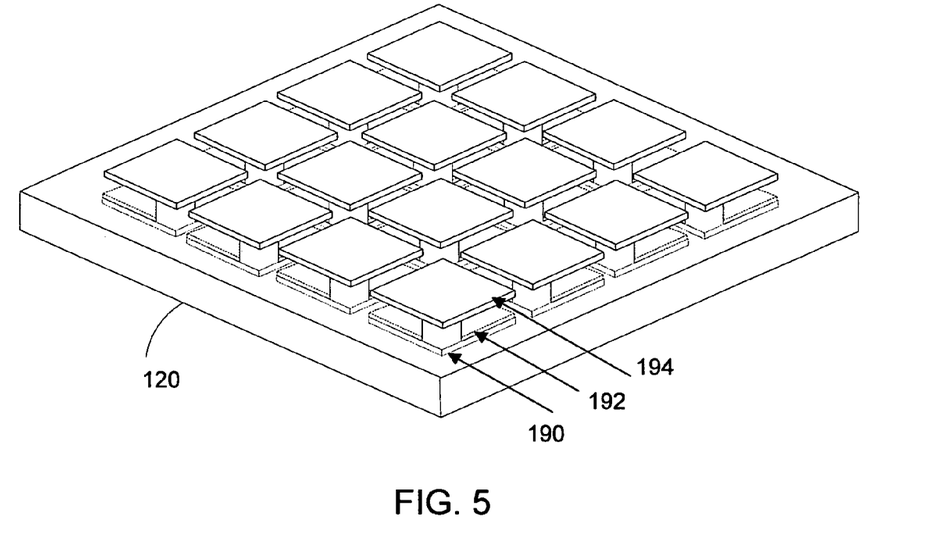
FIG. 5 schematically illustrate a portion of a spatial light modulator having an array of micromirrors.

Referring to FIG. 5, a portion of a spatial light modulator having an array of micromirrors of FIG. 4a and FIG. 4b is illustrated therein. As can be seen in the figure, micromirror array 194 is formed on substrate 120, which is a silicon substrate having electrode array 192 and circuit array 190. Each electrode is connected to a circuit and associated with a mirror plate for rotating the mirror plate.

Figure 6:
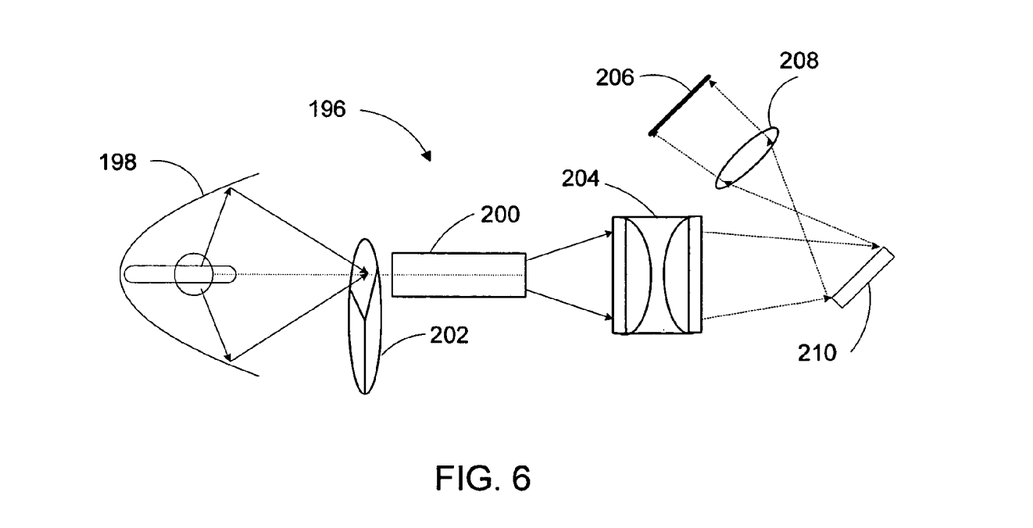
FIG. 6 is a block diagram illustrating an exemplary digital display system employing the spatial light modulator of FIG. 5.

The spatial light modulator in FIG. 5 can be implemented in a digital display system, such as the system in FIG. 6. In its very basic configuration, the display system comprises light source 198, optical devices (e.g. light pipe 200, collection optics 204 and projection optics 208), display target 206 and spatial light modulator 210. Light source 198 (e.g. an arc lamp) directs light through the light integrator/pipe 200 and collection optics 204 and onto spatial light modulator 210. The micromirrors of the spatial light modulator 210 are selectively actuated by a controller (e.g. as disclosed in U.S. Pat. No. 6,388,661 issued May 14, 2002 incorporated herein by reference) so as to reflect—when in their "ON" position—the incident light into projection optics 208, resulting in an image on display target 206 (screen, a viewer's eyes, a photosensitive material, etc.). Exemplary operation methods are disclosed in U.S. Pat. No. 6,388,661, and U.S. patent application Ser. No. 10/340,162, filed on Jan. 10, 2003, both to Richards, the subject matter of each being incorporated herein by reference. Grayscale images can be displayed with the display system using a pulsewidth-modulation technique, and color images can be achieved using color wheel 202.

It will be appreciated by those of skill in the art that a new and useful spatial light modulator has been described herein. In view of the many possible embodiments to which the principles of this invention may be applied, however, it should be recognized that the embodiments described herein with respect to the drawing figures are meant to be illustrative only and should not be taken as limiting the scope of invention. Those of skill in the art will recognize that the illustrated embodiments can be modified in arrangement and detail without departing from the spirit of the invention. Therefore, the invention as described herein contemplates all such embodiments as may come within the scope of the following claims and equivalents thereof.

We claim:

1. An etching method comprising:
   loading a workpiece into an etching chamber, the workpiece comprising a first area to be removed by a spontaneous vapor phase chemical etchant and a second area to remain after the first area being removed, wherein the second area comprises an intermetallic compound;
   providing the spontaneous vapor phase etchant to the etching chamber;
   removing the first area while leaving behind the second area; and
   wherein the chemical etchant comprises a chemical species that is selected from the group consisting of: interhalogens and noble gas halides.

2. The method of claim 1, wherein the intermetallic compound comprises an early transition metal selected from column 4 in the periodic table.

3. The method of claim 1, wherein the intermetallic compound comprises an element that is Tc or Re.

4. The method of claim 1, wherein the intermetallic material is selected from the group consisting of $NiAl_x$, and $TiNi_x$.

5. The method of claim 1, wherein the intermetallic material is $VAl_x$, $WTe_x$, $TiFe_x$, $TiPd_x$, $AlPd_x$, $MoPd_x$, $MoNi_x$, $MoFe_x$, $CoCr_x$, $CoMn_x$, $NiW_x$, $NiV_x$, $NiTi_xAl_y$, $NbAl_x$, $MoPd_x$, $AlCu_x$, $CuZn_x$, or $TaAl_x$.

6. The method of claim 1, wherein the first area comprises a material that is elemental metal, metalloid, metal alloy, metal silicide, $W_xN$ or $TaN_x$.

7. The method of claim 1, wherein the workpiece is a micromirror array.

8. The method of claim 1, wherein the workpiece is a microelectromechanical device.

9. The method of claim 1, wherein the interhalogen comprises bromine trifluoride.

10. The method of claim 1, wherein the noble gas halide comprises xenon difluoride.

11. The method of claim 1, wherein vapor phase etchant further comprises a diluent gas that is a noble gas.

12. The method of claim 1, wherein the intermetallic compound comprises an early transition metal selected from column 5 in the periodic table.

13. The method of claim 1, wherein the intermetallic compound comprises an early transition metal selected from column 6 in the periodic table.

14. The method of claim 1, wherein the intermetallic compound comprises an element that is a late transition metal.

15. The method of claim 14, wherein the intermetallic compound comprises an element that is Ru, Rh, Os, Ir, or Pt.

16. The method of claim 1, wherein the intermetallic compound is $AlTi_x$.

17. The method of claim 16, wherein the workpiece further comprises a barrier layer that remains after removal of the first area.

18. The method of claim 1, wherein the workpiece is a microstructure comprising a silicon substrate.

19. The method of claim 18, wherein the first area comprises amorphous silicon; and wherein the microstructure further comprises a structural layer and a barrier layer disposed between the structural layer and the first area.

20. The method of claim 18, further comprising: removing the barrier layer disposed between the structural layer and the first area.

21. The method of claim 1, wherein the second area further comprises O or N.

22. The method of claim 21, wherein the O or N in the second area is 15 atomic % or less in weight.

23. The method of claim 21, wherein the O or N in the second area is 5% atomic or less in weight.

24. The method of claim 21, wherein O or N in the second area is in a form of $TiO_x$, $TiN_x$, $AlO_x$ or $AlN_x$.

25. A method comprising:
   forming a workpiece, comprising:
      providing a substrate;
      depositing a first and second sacrificial layer on the substrate; and
      forming a first and second structural layers on the sacrificial layers, wherein the first and second structural layers comprises an intermetallic compound;
   loading the workpiece to an etching chamber; and
   removing at least a portion of the first and second sacrificial layers using a spontaneous vapor phase chemical etchant, wherein the chemical etchant comprises a chemical species that is selected from the group consisting of: interhalogens and noble gas halides.

26. The method of claim 25, wherein the intermetallic compound comprises an early transition metal selected from column 4 in the periodic table.

27. The method of claim 25, wherein the intermetallic compound comprises an element that is Tc or Re.

28. The method of claim 25, wherein the intermetallic material is selected from the group consisting of $Ni_xAl_y$ and TiNi.

29. The method of claim 25, wherein the intermetallic material is $VAl_x$, $WTe_x$, $TiFe_x$, $TiPd_x$, $AlPd_x$, $MoPd_x$, $MoNi_x$, $MoFe_x$, $CoCr_x$, $CoMn_x$, $NiW_x$, $NiV_x$, $NiTi_xAl_y$, $NbAl_x$, $MoPd_x$, $AlCu_x$, $CuZn_x$, or $TaAl_x$.

30. The method of claim 25, wherein the first or the second sacrificial layer comprises a material that is elemental metal, metalloid, metal alloy, metal silicide, $W_xN$ or $TaN_x$.

31. The method of claim 25, wherein the workpiece is a micromirror array.

32. The method of claim 25, wherein the workpiece is a microelectromechanical device.

33. The method of claim 25, wherein the interhalogen comprises bromine trifluoride.

34. The method of claim 25, wherein the noble gas halide comprises xenon difluoride.

35. The method of claim 25, wherein vapor phase etchant further comprises a diluent gas that is a noble gas.

36. The method of claim 25, wherein the intermetallic compound comprises an early transition metal selected from column 5 in the periodic table.

37. The method of claim 25, wherein the intermetallic compound comprises an early transition metal selected from column 6 in the periodic table.

38. The method of claim 25, wherein the intermetallic compound comprises an element that is a late transition metal.

39. The method of claim 38, wherein the intermetallic compound comprises an element that is Ru, Rh, Os, Ir, or Pt.

40. The method of claim 25, wherein the intermetallic compound is $AlTi_x$.

41. The method of claim 40, wherein the workpiece further comprises a barrier layer that remains after removal of the first and second sacrificial layers.

42. The method of claim 25, wherein the workpiece is a microstructure comprising a silicon substrate.

43. The method of claim 42, wherein the first or the second sacrificial layer comprises amorphous silicon; and wherein the microstructure further comprises a barrier layer disposed between one of the first and second structural layers and one of the first and second sacrificial layers.

44. The method of claim 43, further comprising: removing the barrier layer.

45. The method of claim 25, wherein the first or the second structural layer further comprises O or N.

46. The method of claim 45, wherein the O or N in the second area is 15 atomic % or less in weight.

47. The method of claim 45, wherein the O or N in the second area is 5 atomic % or less in weight.

48. The method of claim 45, wherein O or N in the second area is in a form of $TiO_x$, $TiN_x$, $AlO_x$ or $AlN_x$.

49. A method for making a microstructure, the method comprising;
   depositing a sacrificial material on a substrate, the sacrificial material comprising a metal;
   depositing a structural layer after depositing the sacrificial material, wherein the structural layer comprises a material other than the sacrificial material, and wherein the material of the structural layer comprises an intermetallic compound; and
   removing the sacrificial material with a spontaneous vapor phase chemical etchant, wherein the chemical etchant comprises a chemical species that is selected from the group consisting of: interhalogens and noble gas halides.

50. The method of claim 49, wherein the sacrificial material comprises at least 25 percent in weight of said metal.

51. The method of claim 49, wherein the sacrificial material comprises at least 50 percent in weight of said metal.

52. The method of claim 49, wherein the sacrificial material comprises at least 90 percent in weight of said metal.

53. The method of claim 49, wherein the interhalogen comprises bromine trifluoride.

54. The method of claim 49, wherein the etchant is mixed with a diluent gas that is He, $N_2$, Ne, Ar, Ke, or Xe.

55. The method of claim 49, wherein the noble gas halide comprises xenon difluoride.

56. The method of claim 55, wherein the metal of the sacrificial material is a transition metal that is an early transition metal.

57. The method of claim 56, wherein the metal is a sputtered elemental metal material.

* * * * *